United States Patent [19]

Sawairi

[11] Patent Number: 5,789,946
[45] Date of Patent: Aug. 4, 1998

[54] ACTIVE PULL DOWN EMITTER COUPLED LOGIC CIRCUIT

[75] Inventor: Akihiro Sawairi, Tokyo, Japan

[73] Assignee: NEC Corporation, Tokyo, Japan

[21] Appl. No.: 758,386

[22] Filed: Nov. 29, 1996

[30] Foreign Application Priority Data

Nov. 29, 1995 [JP] Japan .................... 7-311246

[51] Int. Cl.$^6$ .................................... H03K 19/086
[52] U.S. Cl. ............................ 326/126; 326/91
[58] Field of Search .................. 326/126, 91, 127

[56] References Cited

U.S. PATENT DOCUMENTS

5,506,512  4/1996  Collins .................... 326/126
5,572,152  11/1996 Ueda ...................... 326/126
5,717,347  2/1998  Dufour ................... 326/126

*Primary Examiner*—Edward P. Westin
*Assistant Examiner*—Don Phu Le
*Attorney, Agent, or Firm*—Young & Thompson

[57] ABSTRACT

An active pull-down emitter coupled logic circuit includes a high voltage line, a low voltage line, a first constant current circuit coupled to the low voltage line, first and second main current paths extending between the high voltage line and the first constant current circuit, and first and second subordinate current paths extending between the high voltage line and the first constant current circuit. The subordinate current paths are paired with their respective ones of the main current paths.

8 Claims, 4 Drawing Sheets

ACTIVE PULL DOWN EMITTER COUPLED LOGIC CIRCUIT

BACKGROUND OF THE INVENTION

The present invention relates to a complementary output emitter coupled logic circuit, and more particularly to an active pull-down emitter coupled logic circuit with an emitter follower through which outputs are fetched.

In general, the emitter coupled logic circuit comprises a current switching logic section and first and second emitter follower sections provided at opposite sides of the current switching logic section. A typical one of the conventional emitter coupled logic circuits will be described with reference to FIG. 1. The conventional emitter coupled logic circuit comprises a current switching logic section 10 and first and second emitter follower sections 11 and 12 provided at opposite sides of the current switching logic section 10. Namely, the first and second emitter follower sections 11 and 12 are coupled through the current switching logic section 10 to each other.

Figure 1:
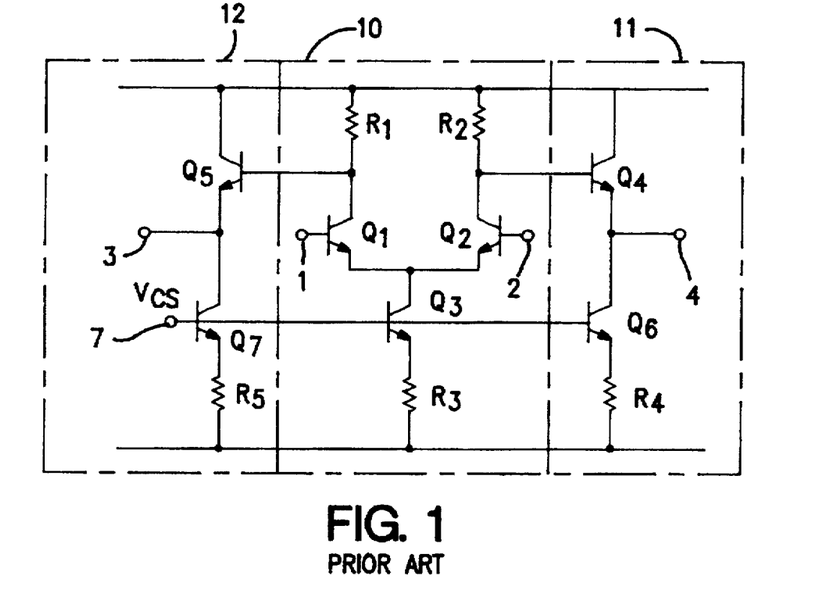
FIG. 1 is a circuit diagram illustrative of the first conventional emitter coupled logic circuit.

The current switching logic section 10 of the emitter coupled logic circuit has the following elements. First and second emitter coupled transistors Q1 and Q2 are provided, wherein emitters of the first and second emitter coupled transistors Q1 and Q2 are coupled to each other. A collector of the first emitter coupled transistor Q1 is coupled via a first resistance R1 to a high voltage line Vcc. A collector of the second emitter coupled transistor Q2 is also coupled via a second resistance R2 to the high voltage line Vcc. A base of the first emitter coupled transistor Q1 serves as a first input terminal through which a first signal is inputted into the emitter coupled logic circuit. A base of the second emitter coupled transistor Q2 serves as a second input terminal through which a second signal is inputted into the emitter coupled logic circuit. The current switching logic section 10 of the emitter coupled logic circuit is further provided with a constant current transistor Q3. A collector of the constant current transistor Q3 is coupled to the emitters of the first and second emitter coupled transistors Q1 and Q2. An emitter of the constant current transistor Q3 is coupled via a third resistance R3 to a low voltage line Vfe. A base of the constant current transistor Q3 is coupled to a voltage terminal 7.

The first emitter follower circuit 11 of the emitter coupled logic circuit has the following elements. First and second emitter follower transistors Q4 and Q6 are provided, wherein the first and second emitter follower transistors Q4 and Q6 and a fourth resistance R4 are coupled in series between the high and low voltage lines Vcc and Vfe. A collector of the first emitter follower transistor Q4 is coupled to the high voltage line Vcc. An emitter of the first emitter follower transistor Q4 is coupled to a collector of the second emitter follower transistor Q6. The emitter of the first emitter follower transistor Q4 and the collector of the second emitter follower transistor Q6 are coupled to a first output terminal 4 from which an output signal is fetched. A base of the first emitter follower transistor Q4 is coupled to the collector of the second emitter coupled transistor Q2 provided in the current switching logic section 10. An emitter of the second emitter follower transistor Q6 is coupled via the fourth resistance R4 to the low voltage line Vfe. A base of the second emitter follower transistor Q6 is coupled to the voltage terminal 7.

The second emitter follower circuit 12 of the emitter coupled logic circuit has the following elements. Third and fourth emitter follower transistors Q5 and Q7 are provided, wherein the third and fourth emitter follower transistors Q5 and Q7 and a fifth resistance R5 are coupled in series between the high and low voltage lines Vcc and Vfe. A collector of the third emitter follower transistor Q5 is coupled to the high voltage line Vcc. An emitter of the third emitter follower transistor Q5 is coupled to a collector of the fourth emitter follower transistor Q7. The emitter of the third emitter follower transistor Q5 and the collector of the fourth emitter follower transistor Q7 are coupled to a second output terminal 3 from which an output signal is fetched. A base of the third emitter follower transistor Q5 is coupled to the collector of the first emitter coupled transistor Q1 provided in the current switching logic section 10. An emitter of the fourth emitter follower transistor Q7 is coupled via the fifth resistance R5 to the low voltage line Vfe. A base of the fourth emitter follower transistor Q7 is coupled to the voltage terminal 7.

The first input terminal 1 in the current switching circuit section 10 receives the first input signal. The second input terminal 1 in the current switching circuit section 10 receives the second input signal which has a fixed value or has an opposite phase to the first signal. As a result, an opposite phase output signal appears on the collector of the first emitter coupled transistor Q1 whist the same phase output signal appears on the collector of the second emitter coupled transistor Q2. The first emitter follower circuit 11 receives the same phase output signal having appeared on the collector of the second emitter coupled transistor Q2. The second emitter follower circuit 12 receives the opposite phase output signal having appeared on the collector of the first emitter coupled transistor Q1. The first output terminal 4 provided in the first emitter follower circuit 11 of the emitter coupled logic circuit is coupled to an external load so that the first emitter follower circuit 11 does drive the external load in accordance with the same phase output signal. The second output terminal 3 provided in the second emitter follower circuit 12 of the emitter coupled logic circuit is coupled to another external load so that the second emitter follower circuit 12 does drive the other external load in accordance with the opposite phase output signal.

The first and second emitter follower circuits 11 and 12 charge and discharge charges that have seen accumulated on an interconnection load capacity during a time when the output level is switched. If the load capacity is large, it takes a longer time to switch the high level output into the low level output due to the following reasons. When the low level output is switched into the high level output, the charge and discharge are carried out through the transistors of the emitter follower circuits 11 and 12 for which reason a large current may flow in a short time. By contrast, if the high level output is switched into the low level output, then the charge having been accumulated on the load capacity has to be pulled down by the constant current source or the pull-down resistance, for which reason it takes a time almost proportional to the load capacity to switch the high level output into the low level output.

In order to solve the above problems, it was proposed to use an active pull-down circuit which pulls down the charge by a large current only when the high level output is switched into the low level output. One of such circuits is disclosed in the Japanese laid-open patent publication No. 3-147420. This conventional active pull-down emitter coupled logic circuit will be described with reference to FIG. 2.

Figure 2:
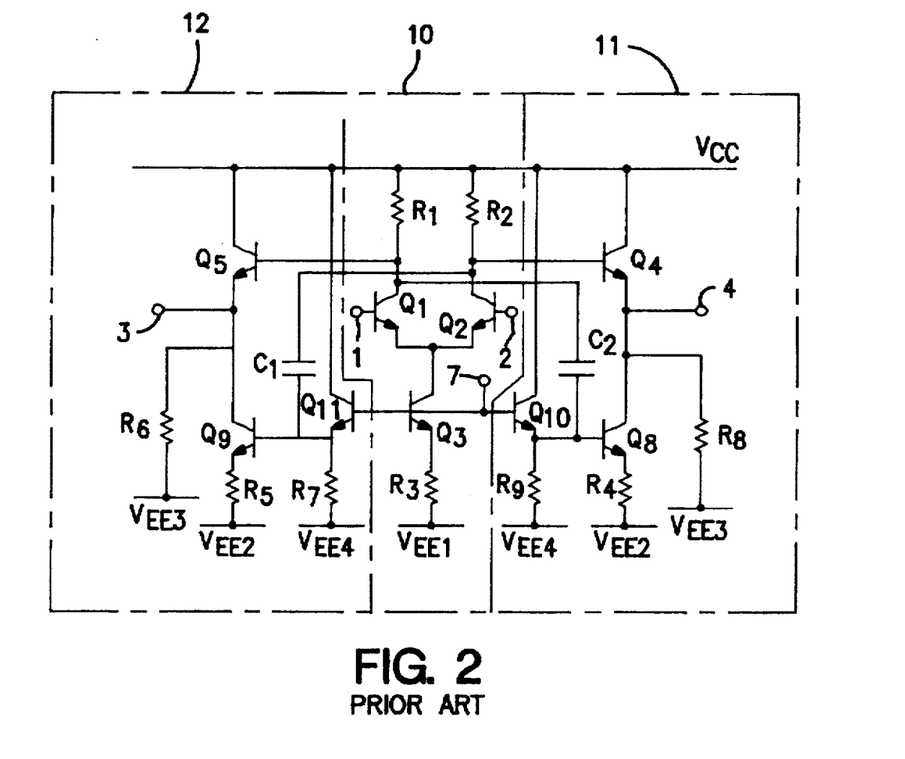
FIG. 2 is a circuit diagram illustrative of the second conventional emitter coupled logic circuit.

The conventional active pull-down emitter coupled logic circuit also comprises a current switching logic section 10 and first and second emitter follower sections 11 and 12 provided at opposite sides of the current switching logic section 10. Namely, the first and second emitter follower sections 11 and 12 are coupled through the current switching logic section 10 to each other. The current switching logic section 10 of the active pull-down emitter coupled logic circuit has the same circuit configuration as that of the emitter coupled logic circuit as illustrated in FIG. 1.

The current switching logic circuit 10 of the active pull-down emitter coupled logic circuit has the following elements. First and second emitter coupled transistors Q1 and Q2 are provided, wherein emitters of the first and second emitter coupled transistors Q1 and Q2 are coupled to each other. A collector of the first emitter coupled transistor Q1 is coupled via a first resistance R1 to a high voltage line Vcc. A collector of the second emitter coupled transistor Q2 is also coupled via a second resistance R2 to the high voltage line Vcc. A base of the first emitter coupled transistor Q1 serves as a first input terminal through which a first signal is inputted into the active pull-down emitter coupled logic circuit. A base of the second emitter coupled transistor Q2 serves as a second input terminal through which a second signal is inputted into the emitter coupled logic circuit. The current switching logic section 10 of the emitter coupled logic circuit is further provided with a constant current transistor Q3. A collector of the constant current transistor Q3 is coupled to the emitters of the first and second emitter coupled transistors Q1 and Q2. An emitter of the constant current transistor Q3 is coupled via a third resistance R3 to a low voltage line Vee1. A base of the constant current transistor Q3 is coupled to a voltage terminal 7.

The first emitter follower circuit 11 of the active pull-down emitter coupled logic circuit has the following elements. First and second emitter follower transistors Q4 and Q8 are provided, wherein the first and second emitter follower transistors Q4 and Q8 and a fourth resistance R4 are coupled in series between the high and low voltage lines Vcc and Vee2. A collector of the first emitter follower transistor Q4 is coupled to the high voltage line Vcc. An emitter of the first emitter follower transistor Q4 is coupled to a collector of the second emitter follower transistor Q8. The emitter of the first emitter follower transistor Q4 is coupled via a fifth resistance R8 serving as a pull-down resistance to the low voltage line Vee3. The emitter of the first emitter follower transistor Q4 and the collector of the second emitter follower transistor Q8 are coupled to a first output terminal 4 from which an output signal is fetched. A base of the first emitter follower transistor Q4 is coupled to the collector of the second emitter coupled transistor Q2 provided in the current switching logic section 10. An emitter of the second emitter follower transistor Q8 is coupled via the fourth resistance R4 to the low voltage line Vee2. A base of the second emitter follower transistor Q8 is coupled to via a first capacitor C2 to the collector of the first emitter coupled transistor Q1. The first emitter follower circuit 11 of the active pull-down emitter coupled logic circuit is further provided with a third emitter follower transistor Q10 and a sixth resistance R9, both of which are connected in series between the high voltage line Vcc and the low voltage line Vee4. A collector of the third emitter follower transistor Q10 is coupled to the high voltage line Vcc. An emitter of the third emitter follower transistor Q10 is coupled via the sixth resistance R9 to the low voltage line Vee4. The emitter of the third emitter follower transistor Q10 is coupled to the base of the second emitter follower transistor Q8. A base of the third emitter follower transistor Q10 is coupled to the voltage terminal 7.

The second emitter follower circuit 12 of the active pull-down emitter coupled logic circuit has the following elements Fourth and fifth emitter follower transistors Q5 and Q9 are provided, wherein the fourth and fifth emitter follower transistors Q5 and Q9 and a seventh resistance R5 are coupled in series between the high and low voltage lines Vcc and Vee2. A collector of the fourth emitter follower transistor Q5 is coupled to the high voltage line Vcc. An emitter of the fourth emitter follower transistor Q5 is coupled to a collector of the fifth emitter follower transistor Q9. The emitter of the fourth emitter follower transistor Q5 is coupled via an eighth resistance R6 serving as a pull-down resistance to the low voltage line Vee3. The emitter of the fourth emitter follower transistor Q5 and the collector of the fifth emitter follower transistor Q9 are coupled to a second output terminal 3 from which an output signal is fetched. A base of the fourth emitter follower transistor Q5 is coupled to the collector of the first emitter coupled transistor Q1 provided in the current switching logic section 10. An emitter of the fifth emitter follower transistor Q9 is coupled via the seventh resistance R5 to the low voltage line Vee2. A base of the fifth emitter follower transistor Q9 is coupled to via a second capacitor C1 to the collector of the second emitter coupled transistor Q2. The second emitter follower circuit 12 of the active pull-down emitter coupled logic circuit is further provided with a sixth emitter follower transistor Q11 and a ninth resistance R7, both of which are connected in series between the high voltage line Vcc and the low voltage line Vee4. A collector of the sixth emitter follower transistor Q11 is coupled to the high voltage line Vcc. An emitter of the sixth emitter follower transistor Q11 is coupled via the ninth resistance R7 to the low voltage line Vee4. The emitter of the sixth emitter follower transistor Q11 is coupled to the base of the fifth emitter follower transistor Q9. A base of the sixth emitter follower transistor Q11 is coupled to the voltage terminal 7.

The third emitter follower transistor Q10 and the sixth resistance R9 forms a first bias circuit coupled to the base of the second emitter follower transistor Q8. The sixth emitter follower transistor Q11 and the ninth resistance R7 also forms a second bias circuit coupled to the base of the fifth emitter follower transistor Q9. The first bias circuit comprising the third emitter follower transistor Q10 and the sixth resistance R9 places the second emitter follower transistor Q8 and the fourth resistance R4 in an off state where no current flows through the second emitter follower transistor Q8 and the fourth resistance R4. At this time a current flows through the fifth resistance R8 serving as the pull-down resistance. The second bias circuit comprising the sixth emitter follower transistor Q11 and the ninth resistance R7 places the fifth emitter follower transistor Q9 and the seventh resistance R5 in an off state where no current flows through the fifth emitter follower transistor Q9 and the seventh resistance R5. At this time a current flows through the eighth resistance R6 serving as the pull-down resistance.

When the high level output signal is switched into the low level output signal, the potential of the base of the second emitter follower circuit Q8 rises from the low level to the high level whereby a large current is pulled down from the output terminal 4 through the second emitter follower transistor Q8 and the fourth resistance R4 until a discharge from the capacitor C2 appears and enters a stationary state, for which reason the output level is rapidly changed. Thereafter, when the low level output signal is changed into the high level output signal, the capacitor C2 is charged by the first bias circuit comprising the third emitter follower transistor Q10 and the sixth resistance R9.

When the high level output signal is switched into the low level output signal, the potential of the base of the fifth emitter follower transistor Q9 rises from the low level to the high level whereby a large current is pulled down from the output terminal 3 through the fifth emitter follower transistor Q9 and the seventh resistance R5 until a discharge from the capacitor C1 appears and enters a stationary state, for which reason the output level is rapidly changed. Thereafter, when the low level output signal is changed into the high level output signal, the capacitor C1 is charged by the second bias circuit comprising the sixth emitter follower transistor Q11 and the ninth resistance R7.

The above active pull-down emitter coupled logic circuit has the following disadvantages.

First, additional processes for forming the capacitance C1 and C2 are required.

Second, there is a need to change the capacitance in accordance with the load. If the capacitance is large, an overshoot appears in dropping the voltage level of the output signal. If the capacitance is small, the drop of the voltage level of the output signal is sluggish.

Third, there is a time delay of the output signal due to an additional load of the capacitance in the current switching circuit.

A circuit independent from the load to the output signal was proposed and is disclosed in Symposium On VLSI Circuits Digest Of Technical Papers, 1993, p. 29, "Capacitor-free level-sensitive active pull-down ECL circuit with self-adjusting driving capability".

Figure 3:
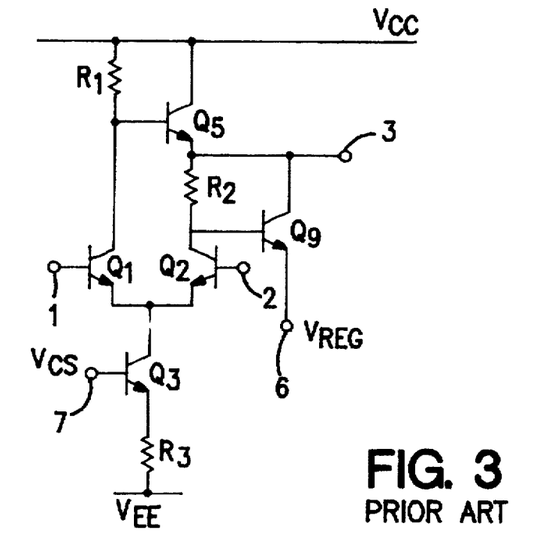
FIG. 3 is a circuit diagram illustrative of the third conventional emitter coupled logic circuit.

This conventional emitter coupled logic circuit will be described with reference to FIG. 3. The conventional emitter coupled logic circuit is designed to have a single phase output.

First and second emitter coupled transistors Q1 and Q2 are provided, wherein emitters of the first and second emitter coupled transistors Q1 and Q2 are coupled to each other. A collector of the first emitter coupled transistor Q1 is coupled via a first resistance R1 to a high voltage line Vcc. A collector of the second emitter coupled transistor Q2 is coupled via a second resistance R2 and an emitter follower transistor Q5 to the high voltage line Vcc. A base of the first emitter coupled transistor Q1 serves as a first input terminal through which a first signal is inputted into the emitter coupled logic circuit. A base of the second emitter coupled transistor Q2 serves as a second input terminal through which a second signal is inputted into the emitter coupled logic circuit. The current switching logic section 10 of the emitter coupled logic circuit is further provided with a constant current transistor Q3. A collector of the constant current transistor Q3 is coupled to the emitters of the first and second emitter coupled transistors Q1 and Q2. An emitter of the constant current transistor Q3 is coupled via a third resistance R3 to a low voltage line Vee. A base of the constant current transistor Q3 is coupled to a voltage terminal 7. An output terminal 3 is provided to be coupled to the emitter of the emitter follower transistor Q5. A pull-down transistor Q9 is provided which has a base connected to the collector of the second emitter coupled transistor Q2. A collector of the pull-down transistor Q9 is coupled to the output terminal 3. An emitter of the pull-down transistor Q9 is coupled to a voltage regulation terminal 6.

In the stationary state, a logic amplitude voltage VL is applied to the resistances R1 and R2 in accordance with the switching state of the current switching state. A constant voltage VL+2VBE is applied between the power terminal 5 and the voltage regression terminal 6. When the low level voltage of the first input terminal is changed to the high level voltage, a voltage applied across the resistance R1 is changed from 0V to VL whilst a voltage applied across the resistance R2 is changed from VL to 0V. If, however, a load capacitance is connected to the output terminal, then an output signal is not rapidly switched from the high level to the low level, for which reason the base potential of the pull-down transistor Q9 increase whereby a large current is pulled down from the output terminal 3 via the pull-down transistor Q9. As a result, the output voltage level is rapidly changed. In the above third conventional emitter coupled logic circuit, a voltage regulation circuit has to be provided to be coupled to the voltage regulation terminal 6 for not only pulling down a large current but also do a temperature compensation, for which reason the circuit configuration is likely to be complicated, whereby the circuitry is not suitable and could not obtain complementary outputs.

One technique for fetching the complementary outputs is disclosed in the Japanese laid-open patent publication No. 3-218118. This fourth conventional emitter coupled logic circuit will be described with reference to FIG. 4. First and second emitter coupled transistors Q1 and Q2 are provided, wherein emitters of the first and second emitter coupled transistors Q1 and Q2 are coupled to each other. A collector of the first emitter coupled transistor Q1 is coupled via a first resistance R1 and a sixth resistance R6 to a high voltage line Vcc. A collector of the second emitter coupled transistor Q2 is coupled via a second resistance R2 and the sixth resistance R6 to the high voltage line Vcc. A base of the first emitter coupled transistor Q1 serves as a first input terminal through which a first signal is input into the emitter coupled logic circuit. A base of the second emitter coupled transistor Q2 serves as a second input terminal through which a second signal is input into the emitter coupled logic circuit. The current switching logic section 10 of the emitter coupled logic circuit is further provided with a constant current transistor Q3. A collector of the constant current transistor Q3 is coupled to the emitters of the first and second emitter coupled transistors Q1 and Q2. An emitter of the constant current transistor Q3 is coupled via a third resistance R3 to a low voltage line Vee1. A base of the constant current transistor Q3 is coupled to a voltage terminal 7.

Figure 4:
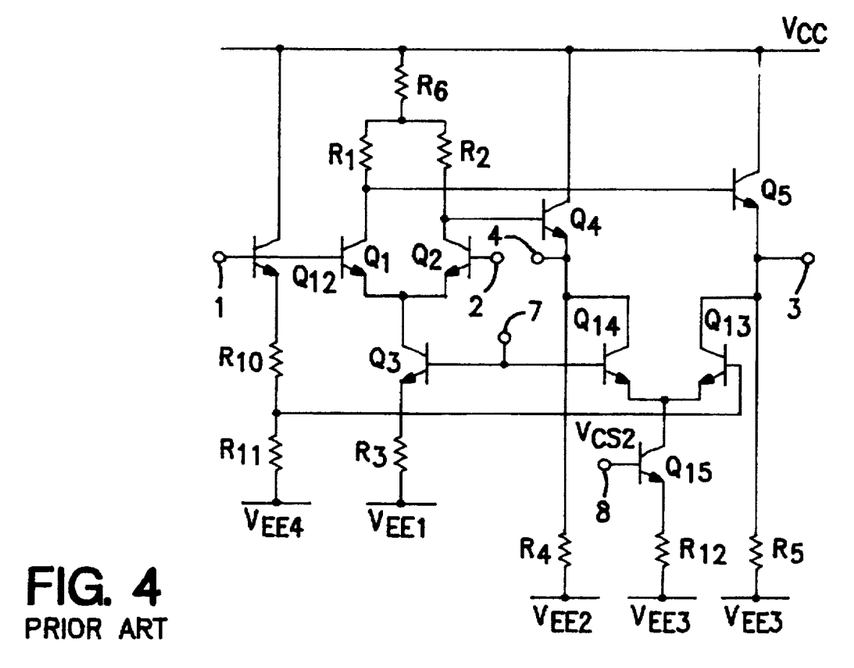
FIG. 4 is a circuit diagram illustrative of the fourth conventional emitter coupled logic circuit.

The fourth conventional emitter coupled logic circuit is further provided at an input stage with a level shifter circuit. The level shifter circuit comprises a series connection of a level shifter transistor Q12 and resistances R10 and R12 between the high voltage line Vcc and the low voltage line Vee4. A collector of the level shifter transistor Q12 is coupled to the high voltage line Vcc. An emitter of the level shifter transistor Q12 is coupled via the resistances R10 and R11 to the low voltage line Vee4. A base of the level shifter transistor Q12 is coupled to the first input terminal 1.

The fourth conventional emitter coupled logic circuit is further provided with an emitter follower circuit. A series connection of a transistor Q4 and a fourth resistance R4 is provided between the high voltage line Vcc and the low voltage line Vee2. A collector of the transistor Q4 is coupled to the high voltage line Vcc. An emitter of the transistor Q4 is coupled via the resistance R4 to the low voltage line Vee2. The emitter of the transistor Q4 is coupled to a terminal 4. A base of the transistor Q4 is coupled to the collector of the second emitter coupled transistor Q2. A series connection of a transistor Q5 and a fifth resistance R5 is furthermore provided between the high voltage line Vcc and the low voltage line Vee2. A collector of the transistor Q5 is coupled to the high voltage line Vcc. An emitter of the transistor Q5 is coupled via the resistance R5 to the low voltage line Vee2. The emitter of the transistor Q5 is coupled to an output terminal 3. A base of the transistor Q5 is coupled to the collector of the first emitter coupled transistor Q1. First and second differential transistors Q13 and Q14 are provided, which are coupled via emitters thereof to each other. A collector of the first differential transistor Q13 is coupled to the output terminal 3. A base of the first differential transistor Q13 is coupled to an intermediate point between the resistances R10 and R11. A collector of the second differential transistor Q14 is coupled to the emitter of the transistor Q4. A base of the second differential transistor Q14 is coupled to the base of the constant current transistor Q3. Moreover, a constant current transistor Q15 is provided, which has a collector coupled to the emitters of the first and second differential transistors Q13 and Q14. An emitter of the constant current transistor Q15 is coupled via a resistance 12 to the low voltage line Vee3. A base of the constant current transistor Q15 is coupled to a terminal 8.

The level shifter shifts the voltage level and supplies the same to the input of the first differential transistor Q13 so as to switch the terminal by which the current is pulled thereby effectively utilizing pull-down currents flowing through the first and second differential transistors Q13 and Q14.

The above fourth conventional emitter coupled logic circuit has the following disadvantages.

First, since the constant voltage Vsc2 is used as a reference voltage for the constant current source in the differential circuit, an additional constant voltage generation circuit is required as a constant current source for a pull-down differential circuit. For this reason, the circuit configuration is complicated and is not suitable for an SSI.

Second, an additional level shifter circuit is further required for generating input signals for the pull-down circuit, resulting in an increase in the current consumption and the number of elements constituting the circuit.

Third, since currents are always applied to the pull-down resistances R4 and R5 in the emitter follower, it is difficult to sufficiently use the current in the pull-down.

In the above circumstances, it was required to develop an improved emitter coupled logic free from the above problems and disadvantages.

SUMMARY OF THE INVENTION

Accordingly, it is an object of the present invention to provide an improved active pull-down emitter coupled logic circuitry free from any disadvantages and problems as described above.

The above and other objects, features and advantages of the present invention will be described from the following descriptions.

The present invention provides an active pull-down emitter coupled logic circuit comprising a high voltage line, a low voltage line, a first constant current circuit coupled to the low voltage line, first and second main current paths extending between the high voltage line and the first constant current circuit. The first and second main current paths are provided thereon with first and second transistors which have emitters coupled to the first constant current circuit. The active pull-down emitter coupled logic circuit further comprises first and second subordinate current paths extending between the high voltage line and the first constant current circuit. The first subordinate current path is paired with the first main current path and the second subordinate current path is paired with the second main current path. The first and second subordinate current paths are provided thereon with third and fourth transistors respectively which have emitters coupled to the first constant current circuit.

The first and second subordinate current paths are further provided thereon with first and second emitter follower transistors respectively which have bases coupled to collectors of the second and first transistors respectively, wherein the first and second emitter follower transistors are arranged between the high voltage line and the third and fourth transistors. The active pull-down emitter coupled logic circuit furthermore comprises first and second output terminals coupled to the emitters of the second and first emitter follower transistors respectively. The active pull-down emitter coupled logic circuit moreover comprises first and second active pull-down transistors having collectors coupled to the second and first output terminals respectively and bases coupled to the collectors of the third and fourth transistors respectively.

The first and second active pull-down transistors may have emitters coupled via a second constant current circuit to the low voltage line.

The second constant current circuit may comprise a series connection of a transistor and a resistance.

The second constant current circuit may alternatively comprise a series connection of a resistance.

The first and second active pull-down transistors may alternatively have emitters coupled respectively via second and third constant current circuits to the low voltage line.

Each of the second and third constant current circuits may comprise a series connection of a transistor and a resistance.

Each of the second and third constant current circuits may alternatively comprise a series connection of a resistance.

The first constant current circuit may comprise a series connection of a transistor and a resistance.

BRIEF DESCRIPTIONS OF THE DRAWINGS

Preferred embodiments of the present invention will be described in detail with reference to the accompanying drawings.

PREFERRED EMBODIMENTS

Figure 5:
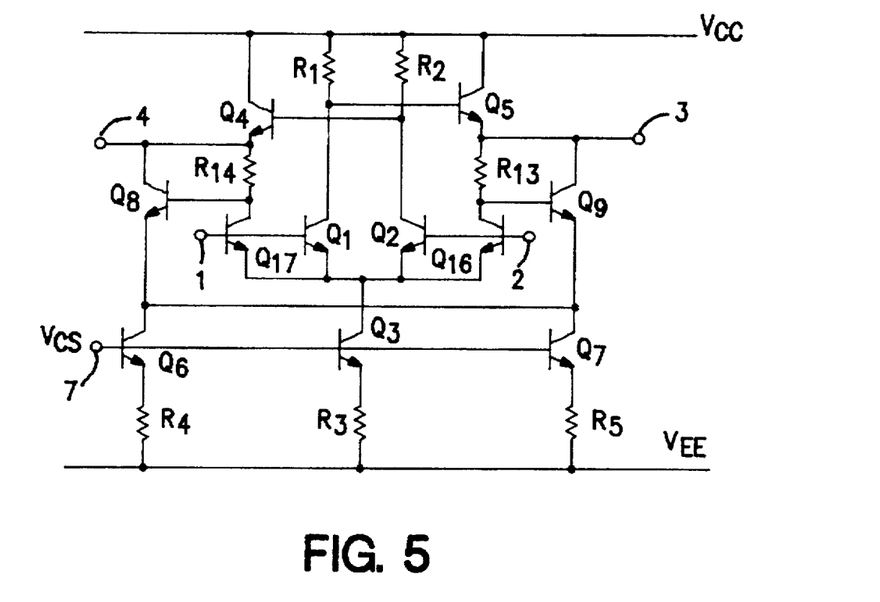
FIG. 5 is a circuit diagram illustrative of an improved active pull-down emitter coupled logic circuit in a first embodiment according to the present invention.

A first embodiment according to the present invention will be described in detail with reference to FIG. 5, wherein an improved active pull-down emitter coupled logic circuit is provided. The improved active pull-down emitter coupled logic circuit has first, second, third and fourth emitter coupled transistors Q1, Q2, Q17 and Q16, where emitters of the first, second, third and fourth emitter coupled transistors Q1, Q2, Q17 and Q16 are coupled to each other. The first and third emitter coupled transistors Q1 and Q17 have bases coupled to a first input terminal through which a first input signal is inputted into the improved active pull-down emitter coupled logic circuit. The second and fourth emitter coupled transistors Q2 and Q16 have bases coupled to a second input terminal through which a second input signal is inputted into the improved active pull-down emitter coupled logic circuit. A collector of the first emitter coupled transistor Q1 is coupled via a first resistance R1 to a high voltage line Vcc. A collector of the second emitter coupled transistor Q2 is coupled via a second resistance R2 to a high voltage line Vcc. A collector of the third emitter coupled transistor Q17 is coupled to a resistance R14 to a high voltage line Vcc. A collector of the fourth emitter coupled transistor Q16 is coupled to a resistance R13 to a high voltage line Vcc. The resistance R14 is coupled via a transistor Q4 to the high voltage line Vcc. The resistance R13 is coupled via a transistor Q5 to the high voltage line Vcc. A collector of the transistor Q4 is coupled to the high voltage line Vcc. An emitter of the transistor Q4 is coupled to the resistance R14. A base of the transistor Q4 is coupled to the collector of the second emitter coupled transistor Q2. A collector of the transistor Q5 is coupled to the high voltage line Vcc. An emitter of the transistor Q5 is coupled to the resistance R13. A base of the transistor Q5 is coupled to the collector of the first emitter coupled transistor Q1. A transistor Q3 is provided as a constant current transistor, which has a collector coupled to the emitters of the first, second third and fourth emitter coupled transistors Q1, Q2, Q17 and Q16. An emitter of the transistor Q3 is coupled via a resistance R3 to the low voltage line Vee. A base of the transistor Q3 is coupled to a reference voltage Vcs terminal 7 to which a constant reference voltage is applied. A first output terminal 3 is provided, which is coupled to the emitter of the transistor Q5. A second output terminal 4 is provided, which is coupled to the emitter of the transistor Q4.

A series connection of transistors Q9, Q7 and a resistance R5 is provided between the first output terminal 3 and the low voltage line Vee. A collector of the transistor Q9 is coupled to the output terminal 3 and also to the emitter of the transistor Q5. A base of the transistor Q9 is coupled to the collector of the fourth emitter coupled transistor Q16. An emitter of the transistor Q9 is coupled to a collector of the transistor Q7. A base of the transistor Q7 is coupled to the base of the transistor Q3 or to the reference voltage terminal 7. An emitter of the transistor Q7 is coupled via the resistance R5 to the low voltage line Vee.

A further series connection of transistors Q8, Q6 and a resistance R4 is provided between the second output terminal 4 and the low voltage line Vee. A collector of the transistor Q8 is coupled to the output terminal 4 and also to the emitter of the transistor Q4. A base of the transistor Q8 is coupled to the collector of the third emitter coupled transistor Q17. An emitter of the transistor Q8 is coupled to an collector of the transistor Q6. The collector of the transistor Q6 is coupled to the collector of the transistor Q7. A base of the transistor Q6 is coupled to the base of the transistor Q3 or to the reference voltage terminal 7. An emitter of the transistor Q6 is coupled via the resistance R4 to the low voltage line Vee.

The second input terminal 2 is applied with a fixed voltage or an opposite phase input signal to the input signal which is input into the first input terminal 1 so that an output signal with an opposite phase to that of the first input terminal 1 appears on the emitter electrode of the transistor Q5 whilst an output signal with the same phase as that of the first input terminal appears on the emitter electrode of the transistor Q4. In each logic section of the above improved emitter coupled logic circuit, current value is divided to in half. In order to maintain the logic amplitude at the same value as the conventional one, the resistance values of the resistances R1, R2, R13 and R14 are respectively set two times of those of the conventional ones.

Operations of the above improved emitter coupled logic circuit will subsequently be described. The following operations of the above improved emitter coupled logic circuit will be described assuming that the first input terminal 1 is applied with the first input signal and the second input terminal is fixed at an intermediate level. Notwithstanding, the operations of the above improved emitter coupled logic circuit substantially remains unchanged even if the first input terminal 1 is applied with the first input signal and the second input terminal is applied with the second input signal opposite in phase to the first input signal.

If the first input terminal 1 is in the high level and the second input terminal is fixed at the intermediate level, The current from the constant current source is divided into two which flow through the first and third emitter coupled transistors Q1 and Q17, whereby a logic amplitude voltage VL is applied across the resistance R1 and across the resistance R14 whilst zero voltage is applied across the across the resistance R2 and across the resistance R13. As a result, the first output terminal 3 enters into the low level whilst the second output terminal 4 enters into the high level. On the other hand, the emitters of the pull-down transistors Q8 and Q9 are coupled directly to each other so that the emitters of the pull-down transistors Q8 and Q9 always have the same potential. If the high level input into the first input terminal 1 is switched to the low level, then a current flow is switched so that zero voltage comes applied across the resistance R1 and across the resistance R14 whilst the voltage VL comes applied across the resistance R2 and across the resistance R13. As a result, a base-emitter voltage of the pull-down transistor Q5 increases so that a large current comes flow through the first output terminal 3 until the output level become high. Simultaneously, a base-emitter voltage of the pull-down transistor Q4 is dropped so that the pull-down transistor Q4 is placed in the off state until the second output terminal 4 become low level.

In the pull-down circuit, during the transient time when the first output terminal 3 has the low level and the voltage VL appears across the resistance R13, a base potential of the pull down transistor Q9 is dropped. Further, since the second output terminal 4 has the high level and zero voltage appears across the resistance R14, a base potential of the pull-down transistor Q8 is risen up. Since the emitter electrodes of the pull-down transistors Q8 and Q9 are coupled to each other to set the same emitter potentials of the pull-down transistors Q8 and Q9, rising up the emitter potential of the pull-down transistor Q8 causes the pull-down transistor Q9 to drop in the base-emitter voltage Vbe and to enter into the off state. As a result, no current flows from the pull-down transistor Q through the constant current transistor Q7 and the resistance R5 whereby a current through the pull-down transistor Q8 is pulled down, resulting in a temporary increase in capability of pulling down the second output terminal up to two times.

As described above, only in the transient time just after the input signal level is changed, the emitter follower at the pull-down side shows zero current supply and increase in pull-down current up to two times whilst the emitter follower at the pull-up side shows no pull-down current whereby the supplied current may be used at the highest efficiency.

Figure 6:
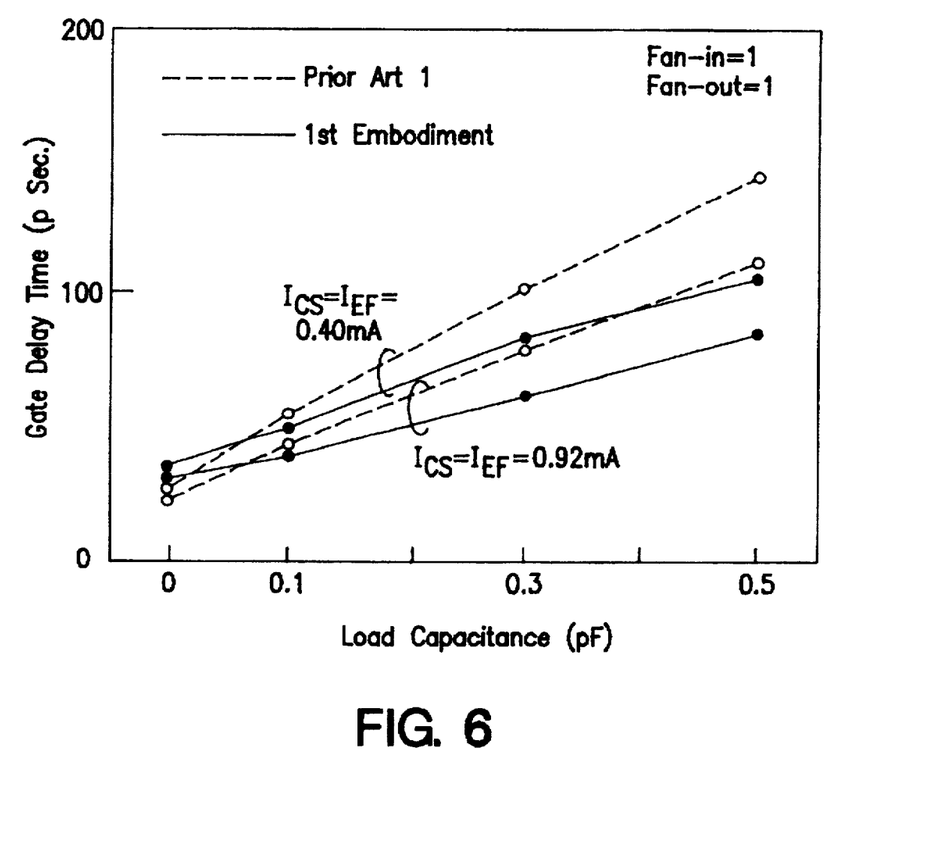
FIG. 6 is a diagram illustrative of properties of an improved active pull-down emitter coupled logic circuit in a first embodiment according to the present invention as compared to those of the first conventional emitter coupled logic circuit.

FIG. 6 illustrates the gate delay time over load capacitance for the improved emitter coupled logic circuit in the first embodiment of the present invention as compared to that of the first conventional emitter coupled logic circuit. If the load capacitance is beyond 0.05 pF, the gate delay time of the improved emitter coupled logic circuit in the first embodiment of the present invention is smaller than that of the first conventional emitter coupled logic circuit. At the load capacitance of 0.5 pF, the performance of the improved emitter coupled logic circuit is 50% higher than that of the first conventional emitter coupled logic circuit. When the gate delay time is the same between the improved emitter coupled logic circuit and the first conventional emitter coupled logic circuit, in order to drive the load capacitance, the improved emitter coupled logic circuit needs only half of the current of the first conventional emitter coupled logic circuit.

As modifications of the above circuit configuration, it is possible to provide a single constant current source for the pull-down transistors Q8 and Q9.

The above improved emitter coupled logic circuit may be applicable to other circuitry, for example, the 2-input OR gate circuit or NOR gate circuit by providing the first the third emitter coupled transistors Q1 and Q17 in parallel to each other wherein the bases of the first the third emitter coupled transistors Q1 and Q17 are parallel in the form of 2-input circuits and the base potentials of the second and fourth emitter coupled transistors Q2 and Q16 are fixed.

The above improved circuit configuration makes it possible obtain the high speed switching performance with providing no additional element nor increase in power consumption.

Figure 7:
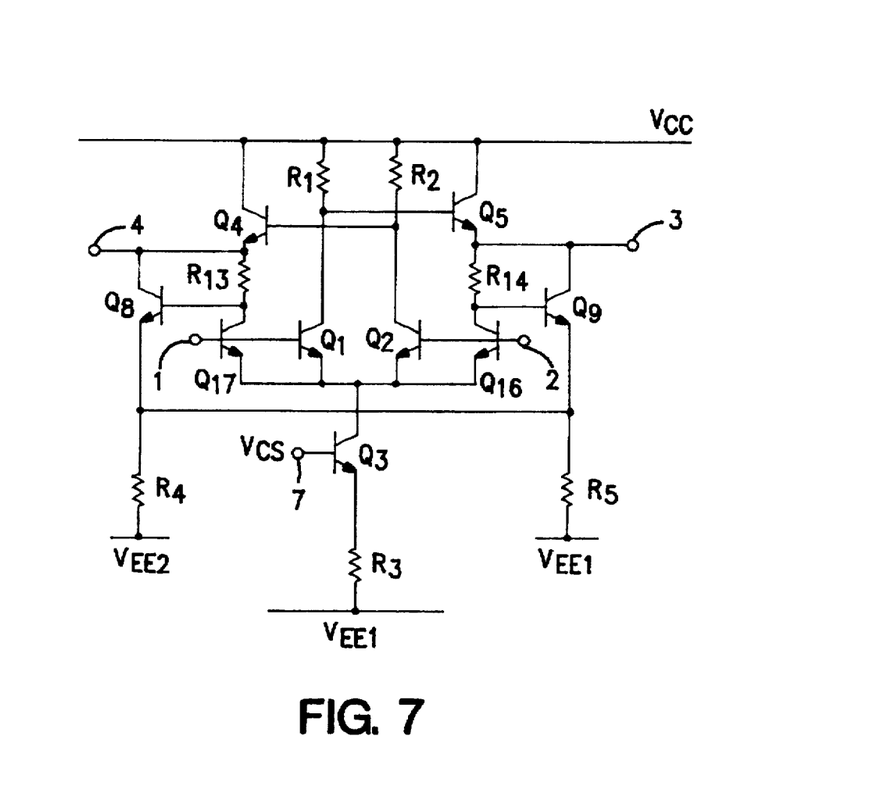
FIG. 7 is a circuit diagram illustrative of an improved active pull-down emitter coupled logic circuit in a second embodiment according to the present invention.

A second embodiment according to the present invention will be described in detail with reference to FIG. 7, wherein an improved active pull-down emitter coupled logic circuit is provided. The improved active pull-down emitter coupled logic circuit has first, second, third and fourth emitter coupled transistors Q1, Q2, Q17 and Q16, where emitters of the first, second, third and fourth emitter coupled transistors Q1, Q2, Q17 and Q16 are coupled to each other. The first and third emitter coupled transistors Q1 and Q17 have bases coupled to a first input terminal through which a first input signal is inputted into the improved active pull-down emitter coupled logic circuit. The second and fourth emitter coupled transistors Q2 and Q16 have bases coupled to a second input terminal through which a second input signal is inputted into the improved active pull-down emitter coupled logic circuit. A collector of the first emitter coupled transistor Q1 is coupled via a first resistance R1 to a high voltage line Vcc. A collector of the second emitter coupled transistor Q2 is coupled via a second resistance R2 to a high voltage line Vcc. A collector of the third emitter coupled transistor Q17 is coupled to a resistance R14 to a high voltage line Vcc. A collector of the fourth emitter coupled transistor Q16 is coupled to a resistance R13 to a high voltage line Vcc. The resistance R14 is coupled via a transistor Q4 to the high voltage line Vcc. The resistance R13 is coupled via a transistor Q5 to the high voltage line Vcc. A collector of the transistor Q4 is coupled to the high voltage line Vcc. An emitter of the transistor Q4 is coupled to the resistance R14. A base of the transistor Q4 is coupled to the collector of the second emitter coupled transistor Q2. A collector of the transistor Q5 is coupled to the high voltage line Vcc. An emitter of the transistor Q5 is coupled to the resistance R13. A base of the transistor Q5 is coupled to the collector of the first emitter coupled transistor Q1. A transistor Q3 is provided as a constant current transistor, which has a collector coupled to the emitters of the first, second third and fourth emitter coupled transistors Q1, Q2, Q17 and Q16. An emitter of the transistor Q3 is coupled via a resistance R3 to the low voltage line Vee1. A base of the transistor Q3 is coupled to a reference voltage terminal 7 to which a constant reference voltage is applied. A first output terminal 3 is provided, which is coupled to the emitter of the transistor Q5. A second output terminal 4 is provided, which is coupled to the emitter of the transistor Q4.

A series connection of a transistor Q9 and a resistance R5 is provided between the first output terminal 3 and the low voltage line Vee1. A collector of the transistor Q9 is coupled to the output terminal 3 and also to the emitter of the transistor Q5. A base of the transistor Q9 is coupled to the collector of the fourth emitter coupled transistor Q16. An emitter of the transistor Q9 is coupled via the resistance R5 to the low voltage line Vee1.

A further series connection of a transistor Q8 and a resistance R4 is provided between the second output terminal 4 and the low voltage line Vee2. A collector of the transistor Q8 is coupled to the output terminal 4 and also to the emitter of the transistor Q4. A base of the transistor Q8 is coupled to the collector of the third emitter coupled transistor Q17. An emitter of the transistor Q8 is coupled via the resistance R4 to the low voltage line Vee2.

The above second input terminal 2 is applied with a fixed voltage or an opposite phase input signal to the input signal which is input into the first input terminal 1 so that an output signal with an opposite phase to that of the first input terminal 1 appears on the emitter electrode of the transistor Q5 whilst an output signal with the same phase as that of the first input terminal appears on the emitter electrode of the transistor Q4. In each logic section of the above improved emitter coupled logic circuit, current value is divided in half. In order to maintain the logic amplitude at the same value as the conventional one, the resistance values of the resistances R1, R2, R13 and R14 are respectively set two times of those of the conventional ones.

In the pull-down operations, the emitter potentials of the pull-down transistors are made equal to higher one so that the voltage is risen by a half of VL. As a result, the voltage applied across the resistance is increased, resulting in a temporary increase in current for pull-down operation. The waveform of the pull-down operation becomes more sharp.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An active pull-down emitter coupled logic circuit comprising:

a high voltage line;

a low voltage line;

a first constant current circuit coupled to said low voltage line;

first and second main current paths extending between said high voltage line and said first constant current circuit, said first and second main current paths being provided thereon with first and second transistors which have emitters coupled to said first constant current circuit;

first and second subordinate current paths extending between said high voltage line and said first constant current circuit, said first subordinate current path being paired with said first main current path and said second subordinate current path being paired with said second main current path, said first and second subordinate current paths being provided thereon with third and fourth transistors respectively which have emitters coupled to said first constant current circuit, said first and second subordinate current paths being further provided thereon with first and second emitter follower transistors respectively which have bases coupled to collectors of said second and first transistors respectively, wherein said first and second emitter follower transistors are arranged between said high voltage line and said third and fourth transistors;

first and second output terminals coupled to said emitters of said second and first emitter follower transistors respectively; and first and second active pull-down transistors having collectors coupled to said second and first output terminals respectively and bases coupled to said collectors of said third and fourth transistors respectively.

2. The active pull-down emitter coupled logic circuit as claimed in claim 1, wherein said first and second active pull-down transistors have emitters coupled via a second constant current circuit to said low voltage line.

3. The active pull-down emitter coupled logic circuit as claimed in claim 2, wherein said second constant current circuit comprises a series connection of a transistor and a resistance.

4. The active pull-down emitter coupled logic circuit as claimed in claim 2, wherein said second constant current circuit comprises a series connection of a resistance.

5. The active pull-down emitter coupled logic circuit as claimed in claim 1, wherein said first and second active pull-down transistors have emitters coupled respectively via second and third constant current circuits to said low voltage line.

6. The active pull-down emitter coupled logic circuit as claimed in claim 5, wherein each of said second and third constant current circuits comprises a series connection of a transistor and a resistance.

7. The active pull-down emitter coupled logic circuit as claimed in claim 5, wherein each of said second and third constant current circuits comprises a series connection of a resistance.

8. The active pull-down emitter coupled logic circuit as claimed in claim 1, wherein said first constant current circuit comprises a series connection of a transistor and a resistance.

* * * * *

UNITED STATES PATENT AND TRADEMARK OFFICE
CERTIFICATE OF CORRECTION

PATENT NO. : 5,789,946
DATED      : August 4, 1998
INVENTOR(S): Akihiro SAWAIRI

It is certified that error appears in the above-indentified patent and that said Letters Patent is hereby corrected as shown below:

Column 7, line 24, change "Vsc2" to --Vcs2--.

Column 9, lines 33-34, change "reference voltage Vcs terminal 7 to which a constant reference voltage is applied." to --reference voltage terminal 7 to which a constant reference voltage Vcs is applied.--.

Signed and Sealed this

Sixth Day of October, 1998

*Attest:*

BRUCE LEHMAN

*Attesting Officer*  *Commissioner of Patents and Trademarks*